(12) United States Patent
Dobos et al.

(10) Patent No.: US 11,818,539 B2
(45) Date of Patent: Nov. 14, 2023

(54) MATCHED BEAMFORMING MICROPHONE ARRAY

(71) Applicant: Harman Becker Automotive Systems GmbH, Karlsbad (DE)

(72) Inventors: Viktor Dobos, Kecskemet (HU); Zoltan Giang-Son Kleinheincz, Pilisborosjeno (HU); Florian Czinege, Budapest (HU)

(73) Assignee: Harman Becker Automotive Systems GmbH, Karlsbad (DE)

( * ) Notice: Subject to any disclaimer, the term of this patent is extended or adjusted under 35 U.S.C. 154(b) by 0 days.

(21) Appl. No.: 17/405,407

(22) Filed: Aug. 18, 2021

(65) Prior Publication Data
US 2022/0060819 A1 Feb. 24, 2022

(30) Foreign Application Priority Data
Aug. 19, 2020 (EP) .................................... 20191816

(51) Int. Cl.
*H04R 1/40* (2006.01)
*G10L 21/0216* (2013.01)

(52) U.S. Cl.
CPC ...... *H04R 1/406* (2013.01); *B81B 2201/0257* (2013.01); *G10L 2021/02166* (2013.01)

(58) Field of Classification Search
None
See application file for complete search history.

(56) References Cited

U.S. PATENT DOCUMENTS

| | | | |
|---|---|---|---|
| 6,812,970 B1 * | 11/2004 | McBride | G08B 13/19693 348/E5.025 |
| 2015/0181346 A1 | 6/2015 | Jingming | |
| 2018/0338205 A1 | 11/2018 | Abraham et al. | |
| 2020/0145763 A1 * | 5/2020 | Nakajima | H05K 3/305 |

OTHER PUBLICATIONS

Extended European Search Report for Application No. 20191816.6, dated Feb. 17, 2021, 8 pages.
Walser S. et al., "MEMS microphones with narrow sensitivity distribution", Sensors and Actuators A: Physical, May 7, 2016, 8 pages, vol. 247.

* cited by examiner

*Primary Examiner* — Paul W Huber
(74) *Attorney, Agent, or Firm* — Brooks Kushman P.C.

(57) ABSTRACT

The disclosure relates to a system, comprising a first circuit board comprising a control circuitry configured to control a beamforming array of microphones, and multiple second circuit boards attached to the first circuit board, each one of the multiple second circuit boards mounting a microphone of the array of microphones.

12 Claims, 8 Drawing Sheets

MATCHED BEAMFORMING MICROPHONE ARRAY

CROSS-REFERENCE TO RELATED APPLICATIONS

This application claims priority to EP application Serial No. 20191816.6 filed Aug. 19, 2020, the disclosure of which is hereby incorporated in its entirety by reference herein.

TECHNICAL FIELD

Various examples relate a beamforming microphone array and to methods for providing the beamforming microphone array including matched microphones. In particular, methods for fabricating a microphone module comprising a primary circuit board and multiple secondary circuit boards are addressed.

BACKGROUND

Beamforming microphone arrays (hereinafter "MA"), which are implemented by multiple microphones operating in tandem, are popular in applications due to their superior performance in signal enhancement and noise suppression. An MA can implement a directed sensitivity for receiving sound waves, by considering a phased relationship between the signal amplitudes and phases measured at the multiple microphones of the MA. Accordingly, the MA is also sometimes referred to as phased MA.

The MA can be used to enhance the desired sound and to reduce the undesired sounds and thus improve the signal-to-noise ratio (SNR) of the system. In aero-acoustic testing, phased arrays are helpful for their ability to quantify and locate noise sources. Typical applications are systems for extracting voice input from ambient noise, such as telephones or speech recognition systems. For example, an MA can be employed in a hands-free calling system in the interior of a passenger vehicle.

Typically, an MA is made up of omnidirectional microphones, directional microphones, or a mix of omnidirectional and directional microphones which are distributed about the perimeter of a space. The microphones are linked to a control circuitry that records and interprets the results into a coherent form. The microphones of the MA can be MEMS (micro-electro-mechanical system) microphones, in which the micro membrane that changes the electrical capacitance is etched directly onto a silicon wafer.

As there are multiple microphone elements in an MA, parameter mismatch across elements is often a concern for achieving sufficient acoustical array performance. Usual microphone matching by MEMS microphone design is +−1 dB at 1 kHz. For using more advanced algorithms, the microphone elements have to match better and on full audio range, for example from 20 Hz to 20 kHz.

SUMMARY

Therefore, there is a need for improved techniques for fabricating MAs with an enhanced close matching between the elements, especially for MEMS MAs.

This object may be solved by the features of the independent claims. The dependent claims define examples.

According to examples, a system comprises a first circuit board comprising a control circuitry configured to control a beamforming array of microphones, and multiple second circuit boards attached to the first circuit board, each one of the multiple second circuit boards mounting a microphone of the array of microphones.

Thus, the system can implement a microphone module.

For example, the microphones could be MEMS microphones. Each microphone may be characterized by a specific frequency response. The frequency response may specify the sensitivity for different frequencies of the soundwaves.

Thereby, a modular MA design is provided. Various microphones each mounted on second circuit boards can be combined in various compositions appropriate for different applications. Any number of elements can be used within an MA, meaning that the microphone module design is scalable. Moreover, this module design makes it possible to do a selection on the MEMS microphones to be included in the microphone module at a state in which the MEMS microphones are soldered on the second circuit boards and before the second circuit boards are attached to the first circuit board. Thereby, matched acoustic characteristics can be obtained for the microphones.

In another example, the multiple second circuit boards are electronically coupled to the first circuit board via a connection which does not require or generate heat during fabricating the connection. For example, a plug-and-socket connection may be used. A soldering may not be used.

Connections which do not need heat for making the connection can have advantages. Influences based on making the connection can be minimized. Such connections are appropriate to prevent changes in the frequency responses. Thus, the connection between the multiple second circuit boards and the first circuit board may have no significant impact on the frequency response or further acoustic properties of the microphones.

According to an example, the multiple second circuit boards are electronically coupled to the first circuit board using at least one of a pin header or a cable. For example, the cable can be a flexible flat cable or a flexible printed circuitry (FPC) cable.

Connections such as a pin header or cables are advantageous as these connection types do not need heat for making the connection. Consequently, influences which can change the characteristics as the frequency response of the microphone can be avoided. This can enable a better matching of the microphones and can increase the performance of the MA.

In an example, for each one of the multiple second circuit boards, the respective microphone is soldered to the respective one of the multiple second circuit boards. After soldering, the microphone on the respective multiple second circuit board, it is possible to make a selection of the microphones to be included in the MA.

In other words, a heat-based connection using soldering points can be made between the multiple second circuit boards and the microphones. The soldering tends to have an impact on the frequency response of the microphones. Thus, it can be helpful to select appropriate second circuit boards having the microphones soldered thereto based on the post-soldering frequency response of the microphones, and/or another acoustic characteristic. This provides for increased flexibility, for example, if compared to a scenario in which all microphones of the MA are soldered to a common circuit board: here, the soldering and the subsequent heat shocks (e.g., for a reflow process of the soldering points) can have a varying impact on the frequency responses of those microphones, e.g., depending on their position on the circuit board. Because the microphones are soldered on the circuit board, flexibility to fix a possible mismatch between the frequency responses is limited in such reference scenarios. More flexibility is given where there is only a single or a few microphones per second circuit board. Then, an appropriate selection can be made that is based on a match of the frequency responses of the microphones.

According to a further example, to each one of the multiple second circuit boards, at least one acoustically-active element is attached. For instance, the acoustically-active element can be selected from the group comprising an acoustic mesh, a sound guide, a sealing, a bezel of the microphone. For example, the respective microphone is encapsulated in an acoustic sealing. The acoustically-active elements can modify the properties of the microphone or can influence the frequency response. For example, at least two of the multiple second circuit boards have different acoustic channels on the microphones. Different acoustic channels can be implemented by different sound channel length, orientation or angle of the sound channel. Using microphones with different acoustic channels allows tailoring the MA according to desired needs.

The disclosure also concerns a method. The method includes mounting, to each second circuit board of a plurality of second circuit boards, at least one microphone using soldering points. The method also includes, upon mounting, applying one or more heat shocks to the plurality of second circuit boards. By these heat shocks, a reflow process of the soldering points is triggered. The method also includes, upon applying of the one or more heat shocks, performing an acoustic characterization of the microphones. The method further includes selecting a subset of the plurality of second circuit boards comprising multiple second circuit boards based on the acoustic characterization. The method further includes forming an MA based on the microphones attached to the subset of the plurality of second circuit boards.

As will be appreciated from the above, a 2-step process is described. In a first step, sub-assemblies are formed, each sub-assembly including a respective second circuit board and one or more microphones per second circuit board. Then, appropriate subsets of the second circuit boards including the microphones can be formed, based on matching acoustic characteristics. These subsets can then be used to form respective MAs.

The selection of matching sub-assemblies happens after the reflow process. In order words, at first a heat shock is applied which influences the frequency response of the microphone and secondly the sorting or ordering of the sub-assemblies is performed based on the post-heat-shock acoustic characteristics. Thus, a selection on the microphones already soldered on the circuit board and already exposed to the heat can be made. In this way, the MEMS elements in the MA can be matched to each other, as the effect of the frequency response change due to soldering can be eliminated by appropriate selection.

Additionally, the forming of the MA of microphones can include attaching the multiple second circuit boards of the subset to a first circuit board. The first circuit board can comprise a control circuitry configured to control the MA. Combining the array elements to an MA can be done after the reflow process and after the sorting, ordering and matching process. By doing so, very close matched MAs without being influenced by soldering heat can be fabricated.

In one example, the attaching of the multiple second circuit boards of the subset to a first circuit board can comprise electronically coupling the multiple second circuit boards to the first circuit board via a connection which does not require or generate heat during fabricating the connection. By avoiding exposure of the system to heat during the process of combining the first and second circuit board, a post-selection alteration of the acoustic characteristics can be avoided.

The subset of second circuit boards can be selected based on a match between the acoustic characterization of the microphones of the plurality of second circuit boards.

As a general rule, various acoustic characteristics could be considered when making the selection of the sub-assemblies forming the MA. For example, the frequency response could be considered. Alternatively or additionally, a directivity of each individual microphone could be considered. Alternatively or additionally, it would be possible to consider one or more acoustically-active elements attached to the respective microphones.

By measuring a batch of microphones, the best matched microphone can be chosen for each MA. Testing of large batches improves the matching and hence the performance of the MA.

The method can further comprise attaching, to each second circuit board of the plurality of second circuit boards, at least one acoustically-active element, wherein the acoustic characterization is performed upon attaching the at least one acoustically-active element. Acoustically-active elements have also an influence on the acoustic behavior, for example the frequency response, of the microphone. The acoustic characterization or the subsequent selection can be done on the microphone including all the acoustically-active elements, such as acoustic mesh and so on.

Taking the influence of the acoustically-active elements into account improves the matching of the microphones and hence the performance of the MA.

In particular, the acoustically-active element can be selected from the group comprising an acoustic mesh, a sound guide, a sealing, a bezel of the microphone.

The features as set forth above, which are described below, can be used not only in the corresponding combinations explicitly set out, but also in other combinations or isolated, without departing from the scope of the present disclosure.

DETAILED DESCRIPTION OF EMBODIMENTS

Figure 1:
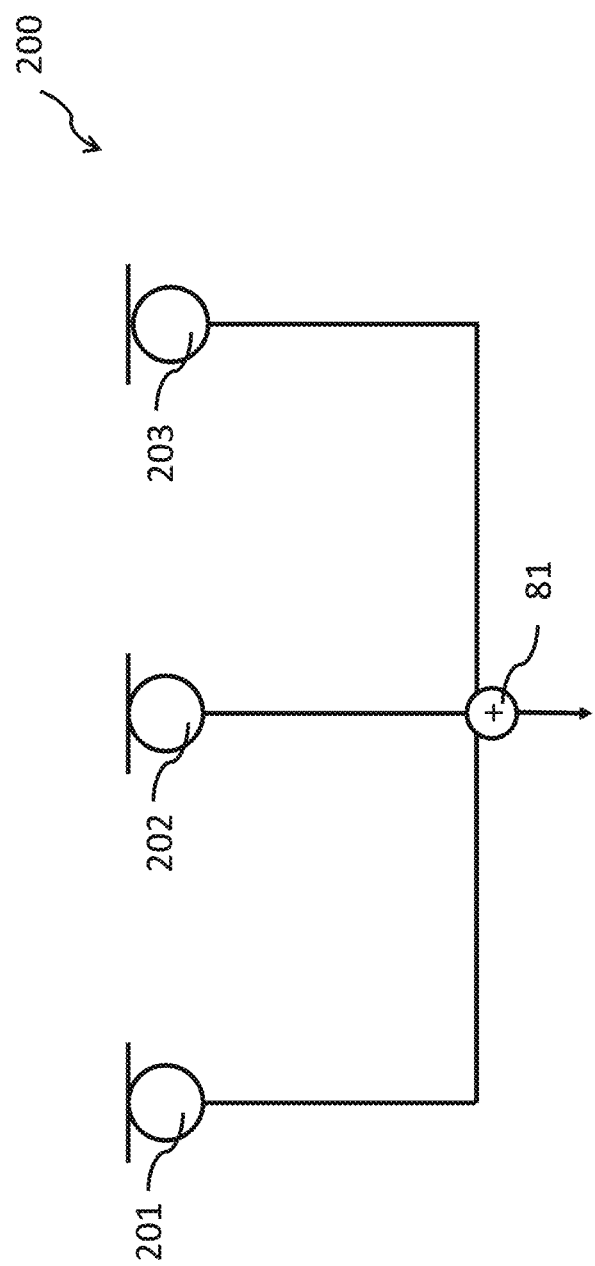
FIG. 1 schematically illustrates an MA and an associated control circuitry according to various examples.

The above-described characteristics, features, and advantages of this disclosure, as well as the manner in which they will be achieved, will become clearer and more clearly understood in connection with the following description of the examples, which will be described in detail in conjunction with the drawings.

Hereinafter, various examples will be described with reference to preferred examples with reference to the drawings. In the figures, similar reference characters designate the same or similar elements. The figures are schematic representations of various examples of the disclosure. Elements shown in the figures are not necessarily drawn to scale. Rather, the various elements shown in the figures are reproduced in such a way that their function and general purpose will be understood by those skilled in the art.

Hereinafter, a 2-step assembly process for an MA will be described. Firstly, multiple sub-assemblies are formed, each sub-assembly including a respective circuit board and one or more microphones are attached thereto. The one or more microphones are attached to the respective circuit board using soldering points. After triggering a reflow process of the soldering points, by using one or more heat shocks, an acoustic characterization of the microphones of the multiple sub-assemblies can be implemented. Based on the acoustic characterization, it is possible to select a subset of the sub-assemblies for forming the MA. In particular, the MA can be built from such microphones that have matching acoustic characterization.

FIG. 1 illustrates aspects relating to the MA 200. The MA 200 includes multiple microphones and control circuitry 81. For example, the multiple microphones 201, 202, 203 can be MEMS microphones. MEMS microphones have an omnidirectional directivity. This means that they respond equally to sounds no matter which direction they come from. Multiple microphones or in particular, MEMS microphones can be configured in a phase-array to form a directional response or a beam pattern. Such an array can be called MA. The MA can be configured to be more sensitive to sound which comes from one or more specific directions than to sound which comes from other directions. Different array configurations are possible, for example, broadside summing arrays or differential endfire arrays, which can have e.g. different spatial and frequency responses advantageous for particular applications.

The control circuitry 81 may be, for example, implemented by an integrated circuit, a microcontroller, or as a Field Programable Gate Array (FPGA) and may be configured to implement a beamforming algorithm. Based on a combination of the signals received from each microphone 201-203, a directivity of the reception sensitivity can be implemented. For example, a weighted combination would be conceivable, considering amplitude and a phase of the signals received from each microphone 201-203. Also, a non-weighted summing would be conceivable. In other scenarios, it is possible that the control circuitry 81 is configured to forward the audio signals received from each microphone 201-203 to a further processing circuitry located off-chip (e.g., a vehicle head unit of a vehicle). It is also possible that the control circuitry 81 encodes the audio signals received from the microphones 201-203, for example, prior to forwarding. It would be possible that the control circuitry 81 is configured to act as a communication interface, for example, for communicating on a vehicle bus system.

For example, the MA is a broadside array and includes three microphones 201, 202, 203 as shown in FIG. 1. In a broadside MA, a line of microphones is arranged perpendicular to the preferred direction of sound waves—having a high reception sensitivity. The microphones or elements of the MA are positioned with an equidistant spacing between each other. Higher numbers of microphones in broadside arrays can achieve greater attenuation of sound from the sides of the MA.

Figure 2:
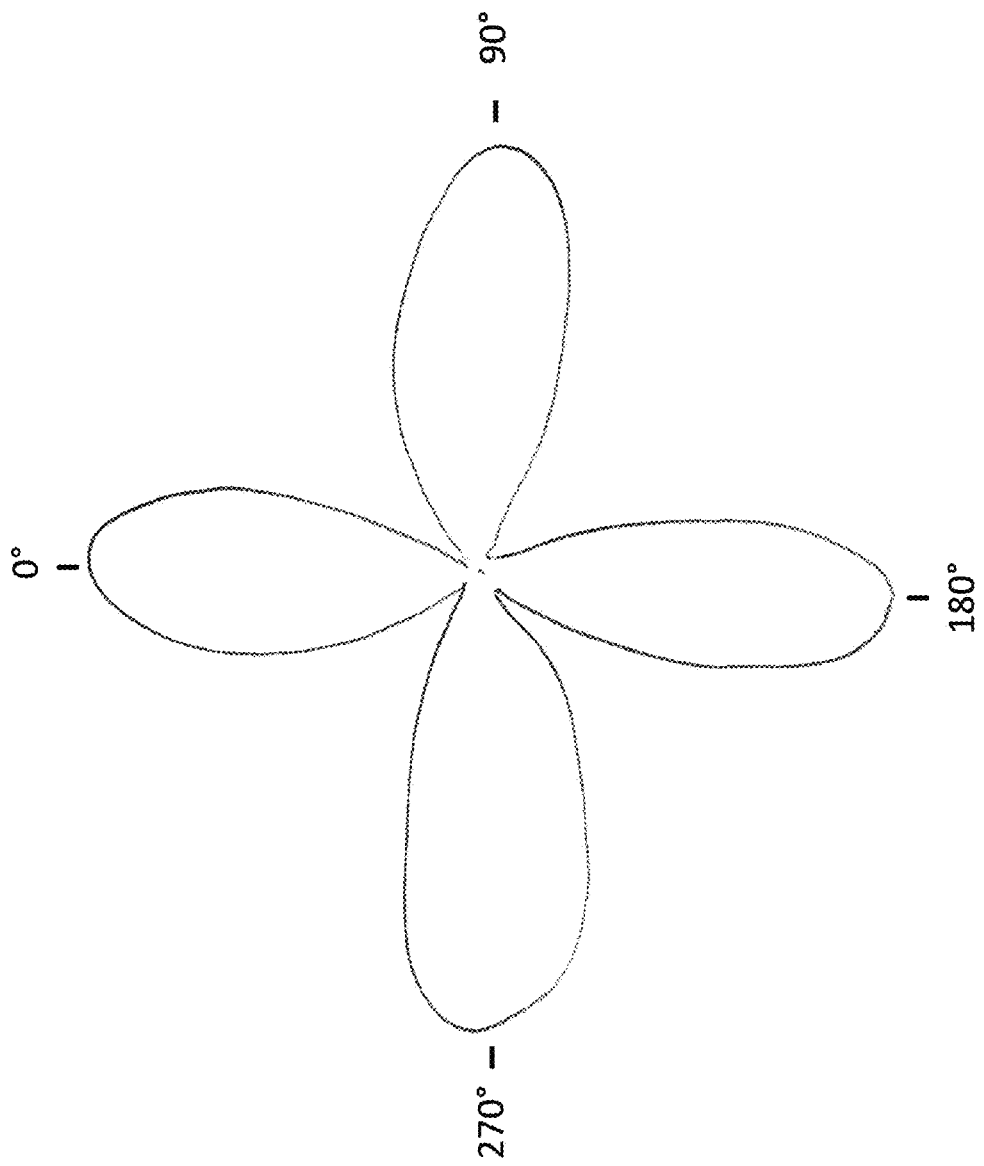
FIG. 2 schematically illustrates a 2-axis polar plot of an MA's directivity according to various examples.

FIG. 2 shows a 2-axis polar plot of a directional sensitivity of the MA of FIG. 1. Directional sensitivity describes the pattern in which the output level of the microphone or array changes when the sound source changes position in an anechoic space. Individual MEMS microphones can have an omnidirectional sensitivity. This entails that the microphones are equally sensitive to sound coming from all directions, regardless of the orientation of the microphone. For an omnidirectional microphone, a 2-axis polar plot of the microphone's response looks the same (e.g., a circle) regardless of whether the microphones port is oriented in the x-y, x-z, or y-z plane. In the polar plot, the front of the array, as the on-axis direction, is the direction of the desired audio pickup and is labeled as 0°. The rear of the array is at 180° and the sides refer to the space in between, centered on 90° and 270°. The polar plot is normalized to the 0° response level.

Figure 3A:
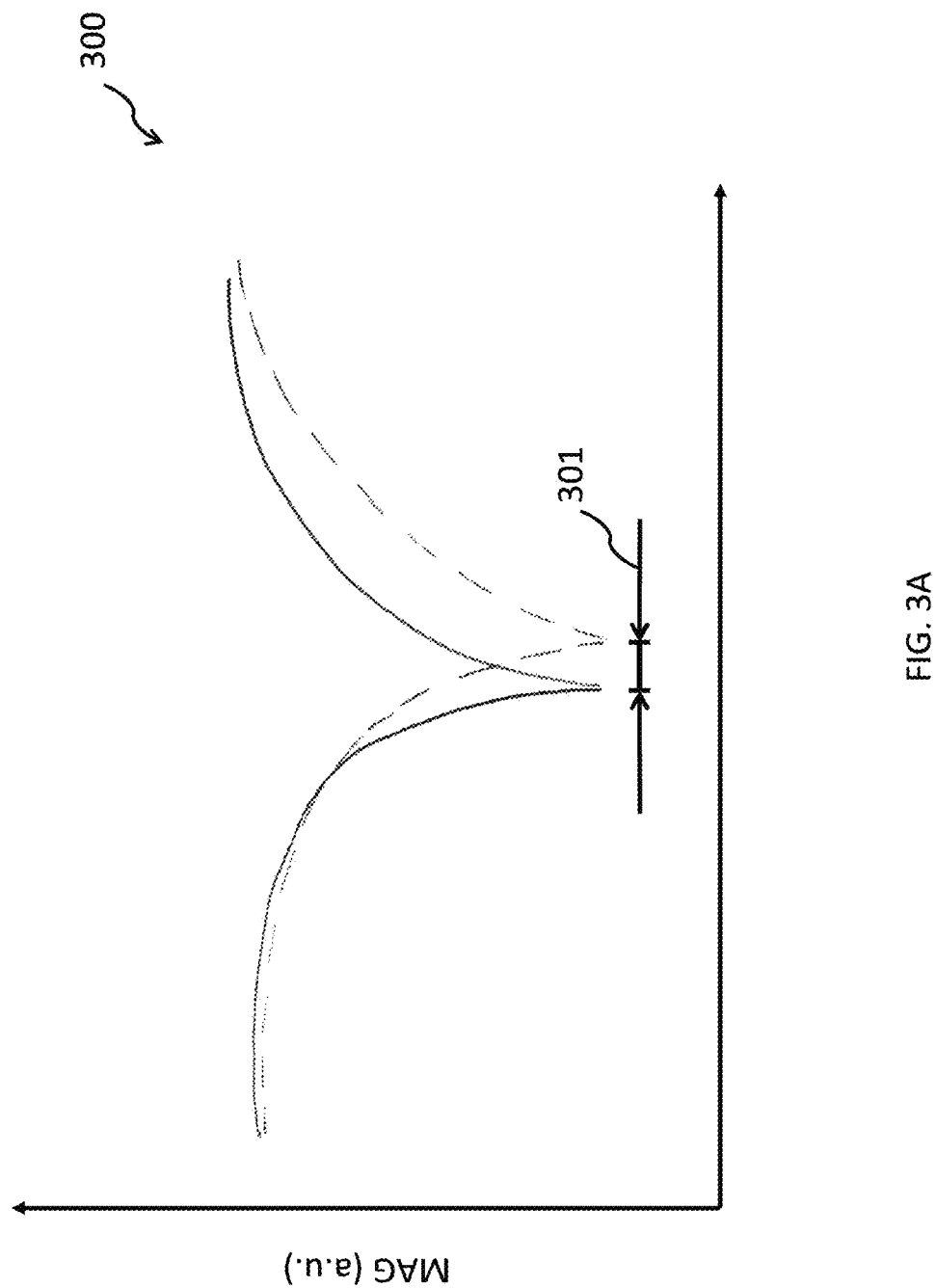
FIG. 3A schematically illustrates frequency responses of an MA according to various examples.

In FIG. 3A, frequency responses 300 of an MA are shown. In particular, a normalized frequency response of a broadside beamformer at different incident angles is illustrated. A broadside beamformer has a flat frequency response, on-axis, since the signals from two microphones receiving the same signal are simply summed up (not shown in FIG. 2). Off-axis, FIG. 2 clearly shows the nulls in the response.

Upon applying a heat-shock (e.g., to trigger a reflow process of soldering points), the frequency response 300 shifts by an offset 301 in frequency (full line vs. dashed line in FIG. 3A). The frequency offset 301 can vary depending on multiple circumstances and it has been observed that it is not always easy to control the magnitude of the offset 301 during assembly.

Figure 3B:
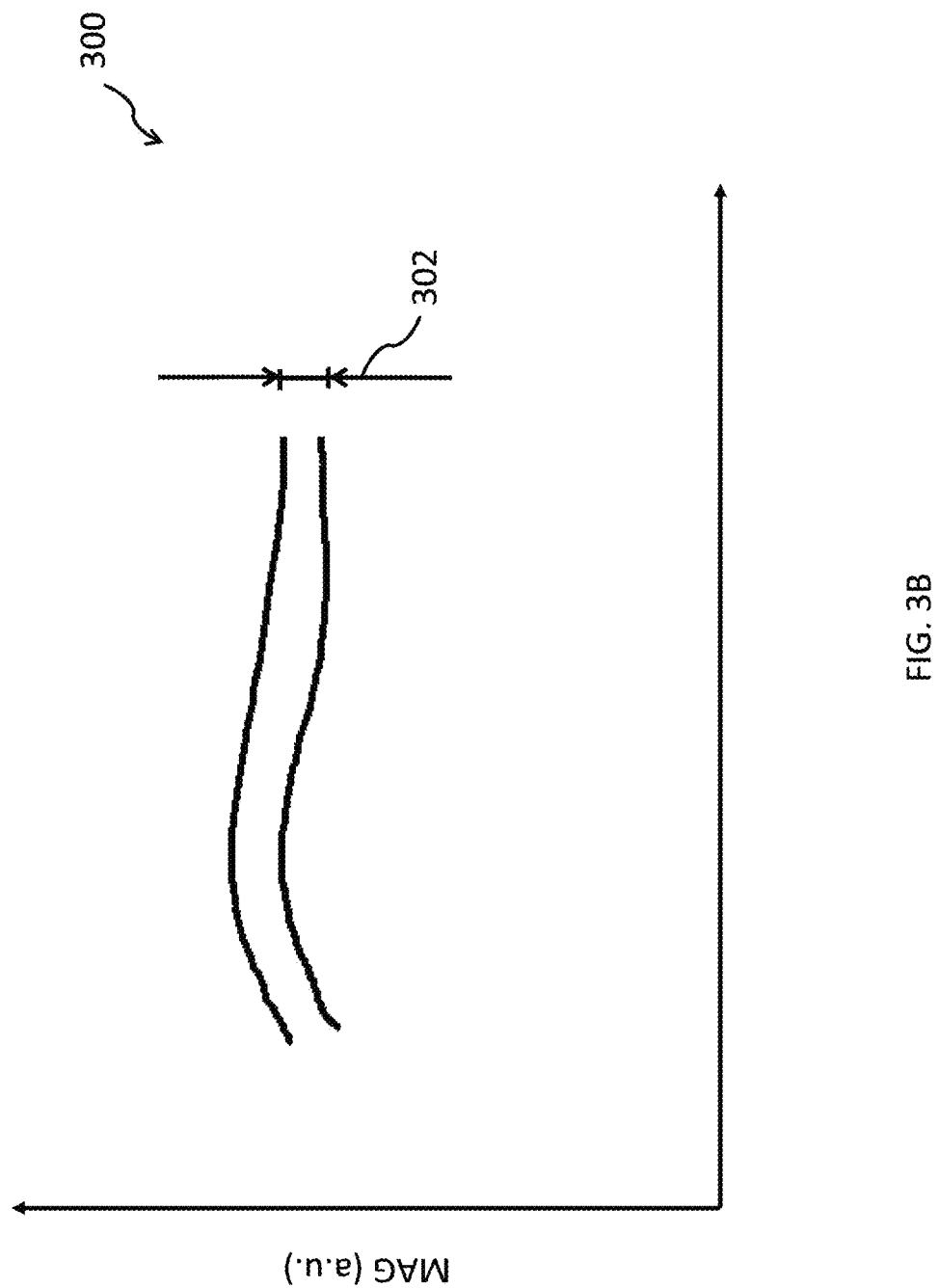
FIG. 3B schematically illustrates frequency responses of an MA according to various examples.

While FIG. 3A shows a frequency offset 301, in other examples, a level offset of the frequency response 300 may be observed, cf. FIG. 3B, offset 302.

According to various examples, a selection of the microphones that are used to form an MA is made after applying the heat-shock. This post-heat-shocked selection is facilitated by a 2-step assembly using sub-assemblies including respective circuit boards mounting the microphones. A respective system forming a microphone module is illustrated in FIG. 4.

Figure 4:
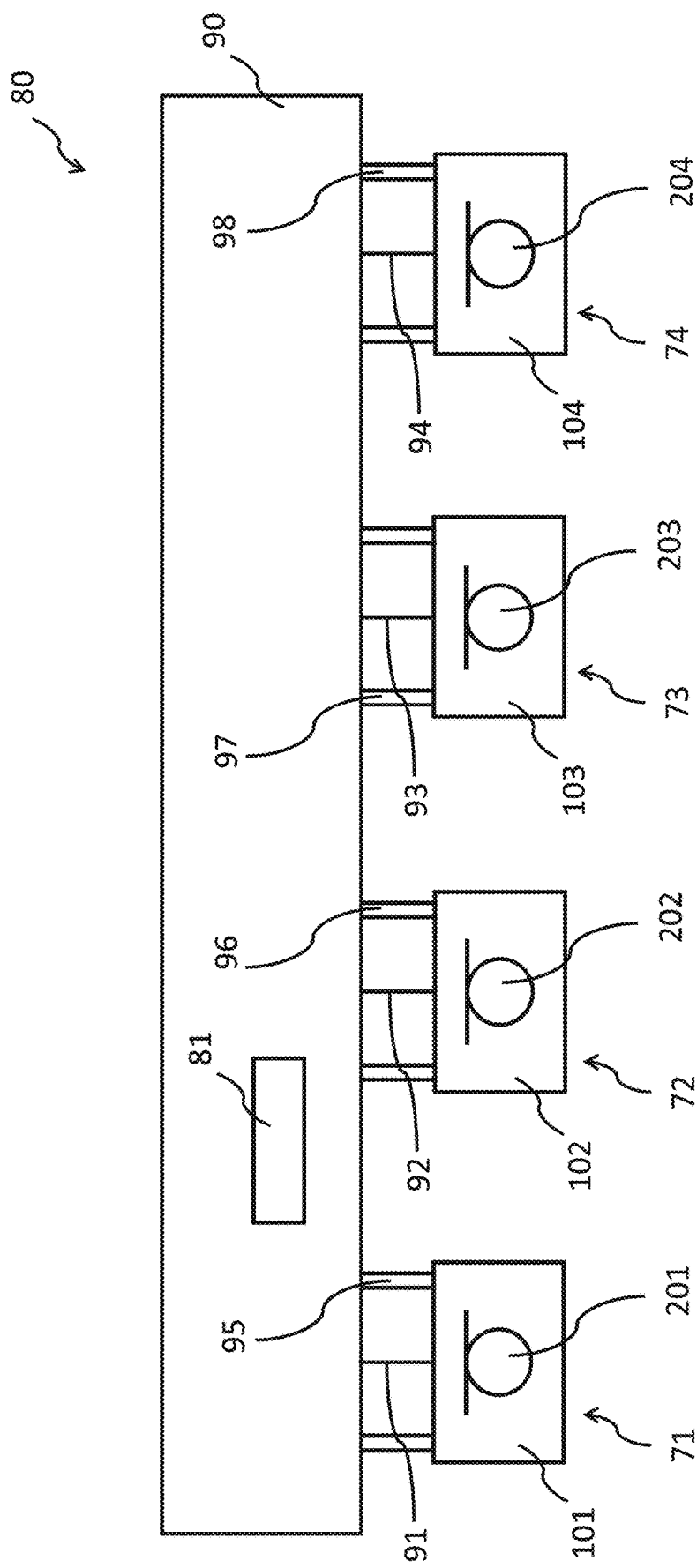
FIG. 4 schematically illustrates a system of a first circuit board and three second circuit boards having each a microphone according to various examples.

In FIG. 4, a system 80 of a first circuit board 90 and four second circuit boards 101-104 having each a microphone 201, 202, 203, 204 is illustrated. The circuit board 101 and the microphone 201 forms a sub-assembly 71; the circuit board 102 and the microphone 202 forms a sub-assembly 72; the circuit board 103 and the microphone 203 forms a sub-assembly 73; and the circuit board 104 and the microphone 204 forms a sub-assembly 74.

Each sub-assembly 71-74 may also include one or more acoustically-active elements (not shown in FIG. 4).

The circuit board 101, for example, a printed circuit board, PCB is mounted to the circuit board 90 or for example, a PCB using one or more physical mounting features 95. The circuit board 102 is mounted to the circuit board 90 using one or more physical mounting features 96. The circuit board 103 is mounted to the circuit board 90 using one or more physical mounting features 97. The circuit board 104 is mounted to the circuit board 90 using one or more physical mounting features 98. For example, a pin-socket connection may be used for the physical mounting features 95-98. For example, a clip-on mounting may be used for the physical mounting features 95-98.

Illustrated in the example of FIG. 4 is a scenario in which, in addition to the physical mounting features 95-98, the circuit boards 101-103 are also electrically connected using electrical connections 91-94. In some examples, the electrical connections 91-94 and the physical mounting features 95-98 may be implemented by the same structural features.

The system 80 includes a number of 4 sub-assemblies 71-74, as a general rule, a larger or smaller count of sub-assemblies may be used.

According to various examples, multiple sub-assemblies including the sub-assembly 71-74 may be formed by attaching one or more microphones on respective circuit boards. Then, the appropriate sub-assembly 71-74 having matched acoustic characteristics of the respective microphones 201-203 may be selected; and the circuit boards 101-104 can be subsequently attached to the circuit board 90. The control circuitry 81 can then control the operation of the formed MA.

Figure 5:
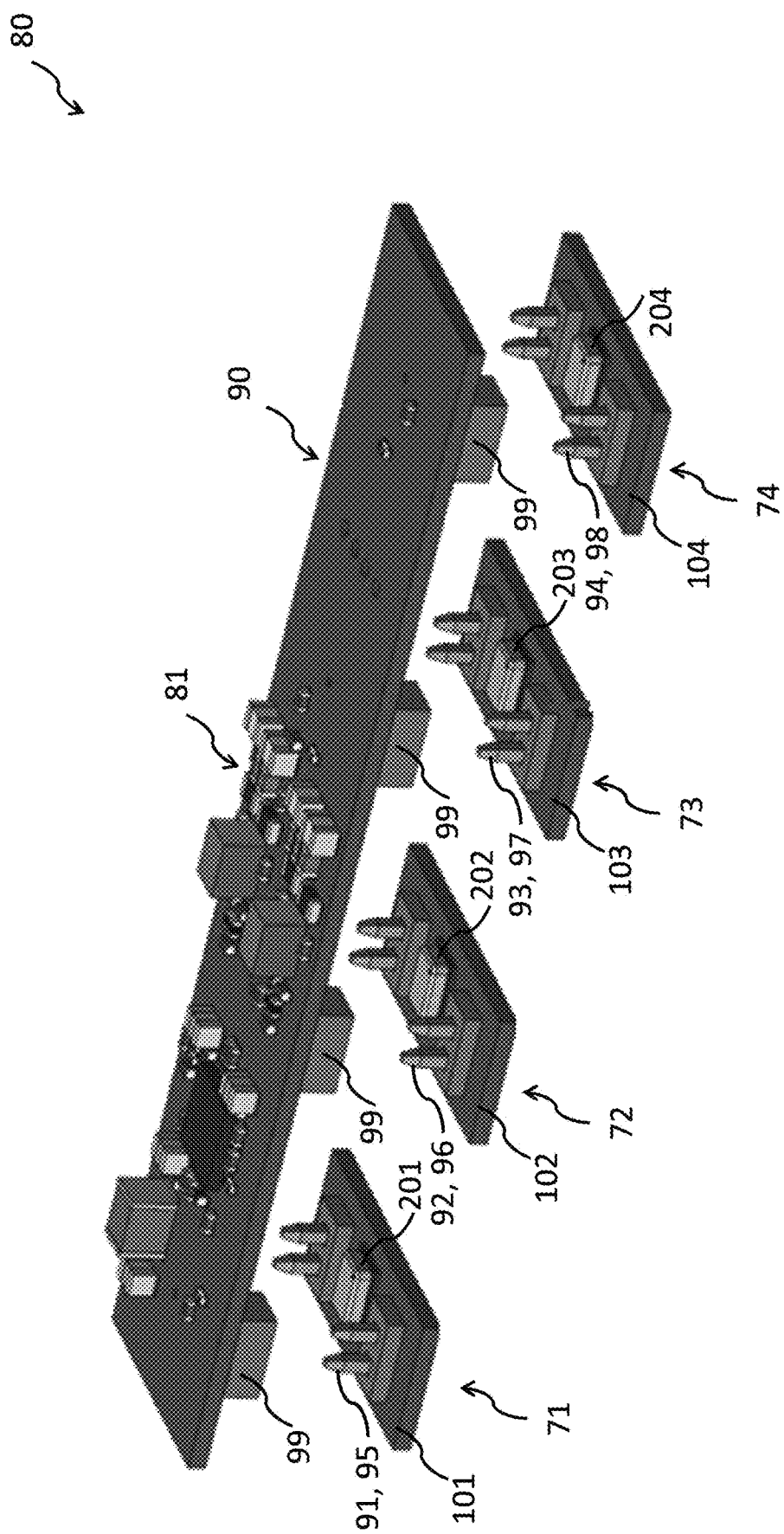
FIG. 5 is a perspective view a possible structural implementation of a system of a first circuit board and four second circuit boards each having a microphone attached thereto according to various examples.

FIG. 5 is a perspective view of a possible structural implementation of the system 80 of FIG. 4, including a first circuit board 90 and four second circuit boards 101, 102, 103, 104 each having a microphone 201, 202, 203, 204 attached thereto according to various examples.

The first circuit board 90 can include parts such as power supply filtering capacitors and connectors for signal and power distribution. The first circuit board 90 can be described as a motherboard. The first circuit board 90 includes the control circuitry 81 combining signals from each one of the microphones 201-204. For example, the microphones are MEMS microphones.

The multiple second circuit boards 101, 102, 103 are electronically and mechanically coupled to the first circuit board 90 via connections 91-98 implemented by metallic pins, more specifically, a pin header that engage into a corresponding socket 99. This plug-and-socket connection does not require or generate heat to form the engagement and electrical connection. Another possible electronic connection would include a cable connection, e.g., combined with a clip-on connection for establishing a mechanical engagement.

For example, the audio signals can be transmitted from each microphone 201-204 to the control circuitry 81 via the electronic connection as discussed above.

For each one of the multiple second circuit boards 101-104, the respective microphone 201-204 is soldered to the respective one of the multiple second circuit boards 101-104. The microphones can be surface mounted components. The microphones can be soldered in a reflow oven. Thereby, a heat shock can be applied to trigger the reflow process.

In one example of the system 80, at least two of the multiple second circuit boards 101-104 have a different acoustic configuration of the microphones 201-204. For example, at least two of the multiple second circuit boards 101-104 have different acoustic channels attached to the microphones 201-204. Alternatively or additionally, one or more other acoustically-active elements may vary between the sub-assembly 71-74, e.g., the type and/or placement with respect to the microphone 201-204. Details with respect to such acoustically-active elements are illustrated in connection with FIG. 6.

Figure 6:
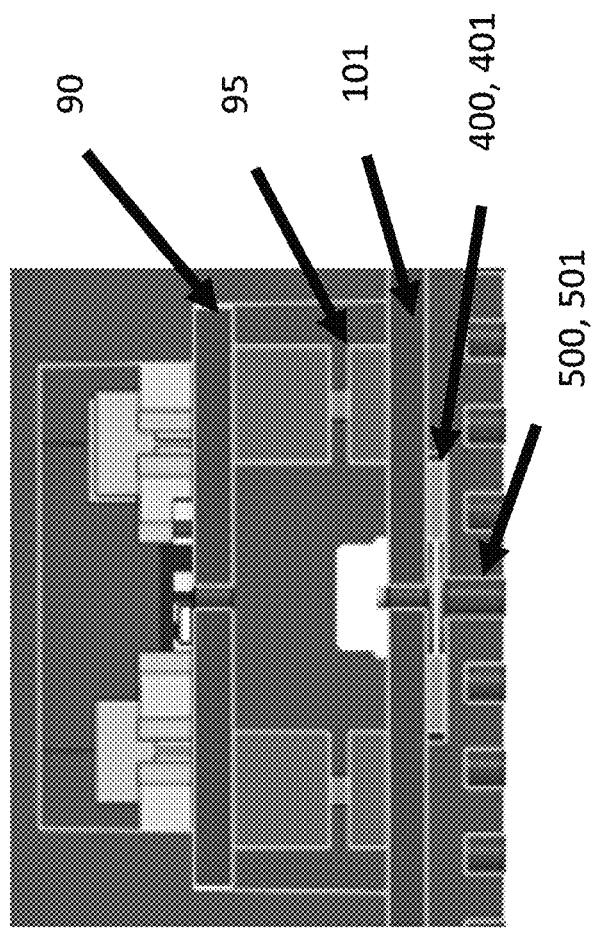
FIG. 6 is a cross-section view of the system of FIG. 5.

FIG. 6 is a detailed cross-section of the first and second circuit board attached to each other according to various examples. This perspective shows multiple acoustically-active elements. One or more acoustically-active elements can be included in each sub-assembly 71-74, e.g., attached to the respective microphone 201-204. The acoustically-active element can be selected from the group comprising: an acoustic mesh 400; a sound guide 500; a sealing 401; and/or a bezel 501 of the microphone 201. The sound guide 500 implements the acoustic channel.

Figure 7:
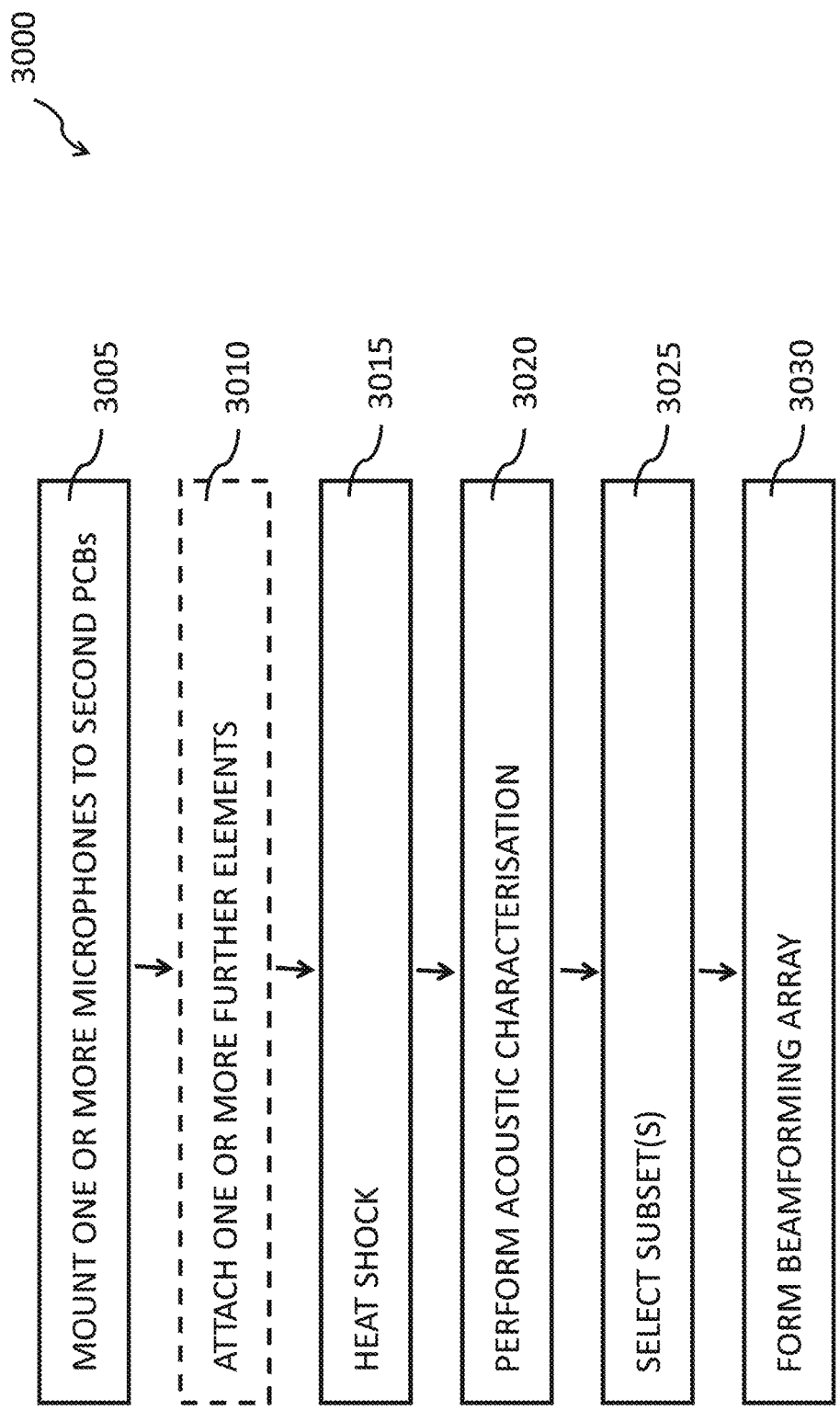
FIG. 7 is a flowchart of a method for fabricating an MA according to various examples.

FIG. 7 shows an example of a method 3000 for a method for fabricating a matched MA. For example, it would be possible to fabricate the system 80 according to FIG. 4 or FIG. 5 using the method 3000. Optional boxes are illustrated with dashed lines.

The method 3000 includes mounting 3005, to each second circuit board of a plurality of second circuit boards, at least one microphone 201 using soldering points.

Upon mounting, the method includes applying 3015 one or more heat shocks to the plurality of second circuit boards, thereby triggering a reflow process of the soldering points.

Upon applying of the one or more heat shocks, the method includes performing 3020 an acoustic characterization of the microphones of the plurality of second circuit boards.

One or more acoustic characteristics can be determined for the microphones. For instance, a frequency response can be measured for each microphone. For instance, a minimum position and/or maximum position of the frequency responses could be determined.

The method further includes selecting 3025 a subset of the plurality of second circuit boards comprising multiple second circuit boards based on the acoustic characterization. In particular, the subset of second circuit boards can be selected based on a match between the acoustic characterization of the microphones of the plurality of second circuit boards. For example, a frequency offset between the frequency positions of minimums or maximums in the frequency responses could be considered.

The method also includes forming 3030 an MA based on the subset of the plurality of second circuit boards. The forming of the MA can include attaching the multiple second circuit boards of the subset to a first circuit board, the first circuit board comprising a control circuitry configured to control the MA. The forming of the MA can include electrically connecting the microphones to the control circuitry on the first circuit board.

This method enables making a selection on microphones already soldered on the second circuit board, after the reflow heat shock. In this way, the frequency responses of the microphones can be matched accurately, as the effect of frequency response change due to soldering is eliminated.

The attaching of the multiple second circuit boards of the subset to a first circuit board at 3030 can include electronically coupling the multiple second circuit boards to the first circuit board via a connection which does not require or generate heat during fabricating the connection. This prevents influences on the frequency response due to heat.

The method 3000 can further include attaching 3010, to each second circuit board of the plurality of second circuit boards, at least one acoustically-active element. The acoustic characterization can be performed upon attaching the at least one acoustically-active element. Elements attached to the second circuit board, like for example an acoustic mesh, can have an effect on the single channel frequency response. The selection process can be done once all the raw materials are attached to the sub-assembly of the second circuit boards. Performing the acoustic characterization after the attaching of the acoustically active elements ensures that all influences on the acoustic behavior of the second circuit boards including all elements are taking into account. This further improves the matching and the performance of the MA.

It is possible that the selecting 3025 depends on a type of acoustically-active elements attached 3010 to the second circuit boards. For example, it would be possible to select 3025 for a given MA such sub-assemblies that include the same types of acoustically-active elements. It would also be possible to select sub-assemblies that include complimentary types of acoustically-active elements, e.g., different acoustic channels, etc.

In some scenarios, it would even be possible that two or more MAs are formed, by selecting multiple subsets, each subset being associated with sub-assemblies of different types of acoustic channels or other acoustic characteristics. For example, a first MA could be formed having sub-assemblies, where a first type of acoustic channel is attached to the respective microphones and the second MA could be formed using the same first circuit board where a second type of acoustic channel is attached to the respective microphones.

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

For example, above, scenarios have been described in which a single microphone is mounted to each second circuit board. As a general rule, it would be possible that multiple microphones mounted to each second circuit board. Still, a post-heat-exposure selection can be possible.

Furthermore, scenarios have been shown in which a single MA is implemented on the first circuit board. It would be possible that multiple MAs are implemented on the first circuit board, for example, using different acoustic channels or hardware filters for the respective microphones. Here, it would be possible that the microphones of each MA are individually matched based on the acoustic characteristics; or it would even be possible that the microphones are matched across multiple MAs.

What is claimed is:

1. A system comprising:
   a first circuit board comprising control circuitry configured to control a beamforming array of microphones, and
   multiple second circuit boards attached to the first circuit board, each one of the multiple second circuit boards mounting a single microphone of the beamforming array of microphones,
   wherein each second circuit board includes a first mounting feature and a second mounting feature positioned thereon to couple the second circuit board to the first circuit board, and
   wherein the corresponding single microphone is positioned between the first mounting feature and the second mounting feature.

2. The system of claim 1, wherein, for each one of the multiple second circuit boards, the respective microphone is soldered to the respective one of the multiple second circuit boards.

3. The system of claim 1,
   further comprising at least one acoustically-active element positioned about each second circuit board and being positioned between the first mounting feature and the second mounting feature.

4. The system of claim 1, wherein at least two of the microphones of the beamforming array of microphones have a different acoustic configuration.

5. The system of claim 3, wherein the respective at least one acoustically-active element is selected from the group comprising: an acoustic mesh; a sound guide; a sealing; and a bezel of the microphone.

6. A system comprising:
   a first circuit board comprising control circuitry configured to control a beamforming array of microphones, and
   a plurality of second circuit boards attached to the first circuit board, each one of the plurality of second circuit boards to receive a single corresponding microphone of the beamforming array of microphones,
   wherein each second circuit board includes a first mounting feature and a second mounting feature positioned thereon to couple the second circuit board to the first circuit board, and
   wherein the corresponding single microphone is positioned between the first mounting feature and the second mounting feature.

7. The system of claim 6, wherein, for each one of the plurality of second circuit boards, the respective single microphone is soldered to the respective one of the plurality of second circuit boards.

8. The system of claim 6,
   further comprising at least one acoustically-active element positioned about each second circuit board and being positioned between the first mounting feature and the second mounting feature.

9. The system of claim 6, wherein at least two microphones of the beamforming array of microphones have a different acoustic configuration.

10. The system of claim 6, wherein each microphone of the beamforming array of microphones is a micro-electro-mechanical system (MEMS) microphone.

11. The system of claim 10, wherein each MEMS microphone is omni-directional.

12. The system of claim 8, wherein the at least one acoustically-active element is selected from the group comprising: an acoustic mesh; a sound guide; a sealing; and a bezel of the microphone.

* * * * *